United States Patent [19]
Advani

[11] Patent Number: 6,072,733
[45] Date of Patent: Jun. 6, 2000

[54] PROGRAMMABLE SENSE AMPLIFIER DELAY (PSAD) CIRCUIT WHICH IS MATCHED TO THE MEMORY ARRAY

[75] Inventor: Manik Advani, Fremont, Calif.

[73] Assignee: Waferscale Integration, Inc., Fremont, Calif.

[21] Appl. No.: 08/953,690

[22] Filed: Oct. 17, 1997

[51] Int. Cl.[7] ..................................................... G11C 7/00
[52] U.S. Cl. ................ 365/194; 365/189.09; 365/189.05
[58] Field of Search ............................... 365/194, 189.09, 365/189.05, 211; 326/32, 33; 327/534, 535, 536, 537, 158

[56] References Cited

U.S. PATENT DOCUMENTS

| | | | |
|---|---|---|---|
| 4,894,561 | 1/1990 | Nogami | 307/443 |
| 5,424,985 | 6/1995 | McClure et al. | 365/194 |
| 5,638,333 | 6/1997 | Lee | 365/205 |

*Primary Examiner*—Vu A. Le
*Attorney, Agent, or Firm*—Skjerven, Morrill MacPherson, Franklin & Friel LLP

[57] ABSTRACT

A programmable sense amplifier delay (PSAD) circuit that is matched to the response of the memory array due to temperature and voltage supply Vcc. The circuit includes an inverter, a pull-up transistor, a pull-down transistor of the type of the cells of the memory array and a plurality of capacitors. The inverter responds to a predetermined voltage drop between the voltage level of the voltage source and the voltage on the input line. The pull-up transistor is connected between the voltage source Vcc and the input line and is activatable during a pre-charge phase of the memory array to raise the voltage level of the input line towards the voltage source. The pull-down transistor is connected between the input line and a ground source and is activatable after the pre-charge phase to discharge the voltage level of the input line. The capacitors are selectively connected in parallel to the pull-down transistor and define the speed at which the pull-down transistor discharges the input line. The invention also incorporates the voltage drop inverter.

9 Claims, 3 Drawing Sheets

PROGRAMMABLE SENSE AMPLIFIER DELAY (PSAD) CIRCUIT WHICH IS MATCHED TO THE MEMORY ARRAY

FIELD OF THE INVENTION

The present invention relates to programmable sense amplifier delay (PSAD) circuits generally and to such PSAD circuits which are matched to the response of their memory array in particular.

BACKGROUND OF THE INVENTION

Programmable sense amplifier delay (PSAD) circuits are known in the art of circuits for semiconductor memory array chips and are utilized to delay the output of a sense amplifier until the sense amplifier has finished sensing the data of a cell of a memory array. This is shown in FIG. 1 to which reference is now made.

The memory array 10 has a cell 12 that is to be read by a sense amplifier 14. The sense amplifier 14 determines the value of the data in the cell 12 by comparing its value to two reference values, "REF1" and "REF0" and producing an output signal, DAT. The output signal DAT is then passed through a trip inverter 16 before being latched by a latch 18.

Because the output signal DAT is invalid until the sense amplifier 14 has finished sensing the data in the cell 12, the trip inverter 16 is shorted by a switchable line 20 having a switch 22 therein. During sensing, switch 22 is closed and line 20 connects the output of trip inverter 16 with its input. The result is that the output signal DAT is maintained at a middle voltage between the two reference values. When sensing is finished, switch 22 is opened and the output signal DAT is allowed to propagate to latch 18.

Switch 22 is controlled by a PSAD 24 whose delay is programmable and is typically set to approximately match the sensing time of the sense amplifier 14. As shown in the timing diagram of FIG. 2, to which reference is now made, an "EQ" signal is generated when an address signal is received. The EQ signal prepares both the array 10 and the PSAD 24 (which typically receives the complement EQB signal) for sensing. Upon the fall of the EQ signal, the sense amplifier 14 begins sensing and the PSAD 24 begins measuring the time. FIG. 2 indicates that the DAT signal out of the sense amplifier 14 is ready slightly before the INR signal out of the PSAD 24 and thus, the data of cell 12 will be read only once it is ready.

Since the chip of the memory array can operate under a wide variety of temperatures and some variety of input voltage levels, the PSAD delay must be set to cover all possibilities. Typically, for an electrically programmable read only memory (EPROM) array, this is done by determining the delay for the worst combination of temperature and voltage level. This provides the maximal delay, but not the optimal delay, per sensing condition.

For FLASH electrically erasable programmable read only memory (EEPROM) arrays, this is not possible. FLASH EEPROMs effect an erase by programming all cells to a known high value, providing a pulse of negative voltage and then sensing to determine if the cells now store a low value. Further negative pulses are provided only if the cells have not changed value. Since sensing defines the point where erasure stops, if erasure occurs at one temperature and voltage level and the chip is then utilized (read and programmed) at another temperature and voltage level, it is possible that the erasure might not be complete for the second sensing condition. This happens if the variation with respect to temperature and voltage supply Vcc of the PSAD delay is different from that of the sensing time. In this case, the data written therein might not be readable at the second sensing condition.

U.S. Pat. No. 4,894,561 to Nogami describes a CMOS inverter which has compensation for temperature and voltage variations.

SUMMARY OF THE INVENTION

An object of the present invention is to provide a programmable sense amplifier delay (PSAD) circuit that is matched to the memory array. In particular, the PSAD circuit of the present invention has the same or similar variations in response due to temperature and voltage supply Vcc as does the memory array.

In accordance with a preferred embodiment of the present invention, the circuit includes an inverter, a pull-up transistor, a pull-down transistor of the type of the cells of the memory array and a plurality of capacitors. The inverter responds to a predetermined voltage drop between the voltage level of the voltage source Vcc and the voltage on the input line. The pull-up transistor is connected between the voltage source Vcc and the input line and is activatable during a pre-charge phase of the memory array to raise the voltage level of the input line towards the voltage source. The pull-down transistor is connected between the input line and a ground source and is activatable after the pre-charge phase to lower the voltage level of the input line. The capacitors are selectively connected in parallel to the pull-down transistor and define the speed at which the pull-down transistor discharges the input line. The invention also incorporates the voltage drop inverter.

Additionally, in accordance with a preferred embodiment of the present invention, the inverter includes a two transistor inverter controlled by a varying control signal and receiving the voltage source signal Vcc as input and a unit which produces and applies a reference current through said two transistor inverter. The reference current is fixed with respect to the voltage level of the voltage source. The two transistor inverter trips when the varying control signal is below the voltage source signal by a predetermined amount, where the predetermined amount is defined by the size of the two transistor inverter and the strength of the first reference current. The predetermined amount does not vary with respect to the voltage level of the voltage source nor with respect to temperature.

Moreover, in accordance with a preferred embodiment of the present invention, the unit for producing and applying includes at least one transistor and a current mirror. The transistor is controlled by a reference signal and receives a voltage source as input, wherein the reference signal tracks the voltage source. The transistor produces a second reference current. The current mirror is connected between the output of the transistor and a ground connection of the two transistor inverter and mirrors a version of the second reference current to the ground connection, thereby to produce the first reference current.

Finally, in accordance with a preferred embodiment of the present invention, the first reference current varies with temperature, the two transistor inverter includes one p-channel transistor and one n-channel transistor and the p-channel transistor is biased to match the temperature variation of the first reference current.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 3:
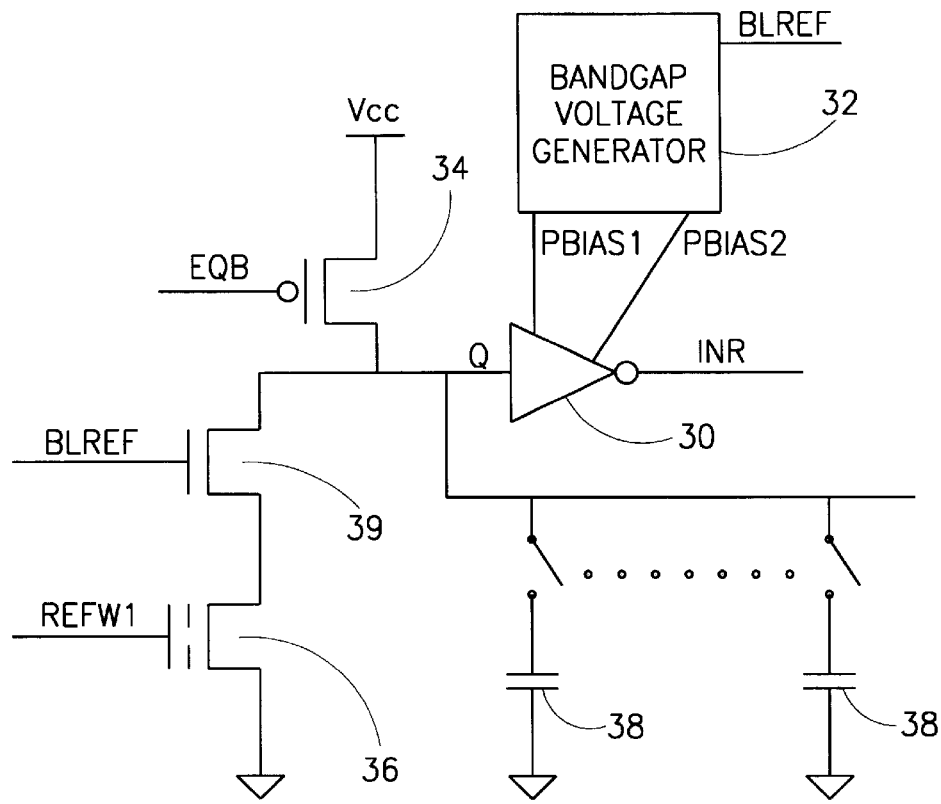
FIG. 3 is a schematic illustration of a PSAD which generally has the same response to temperature and voltage as does the memory array, constructed and operative in accordance with a preferred embodiment of the present invention.
Figure 4:
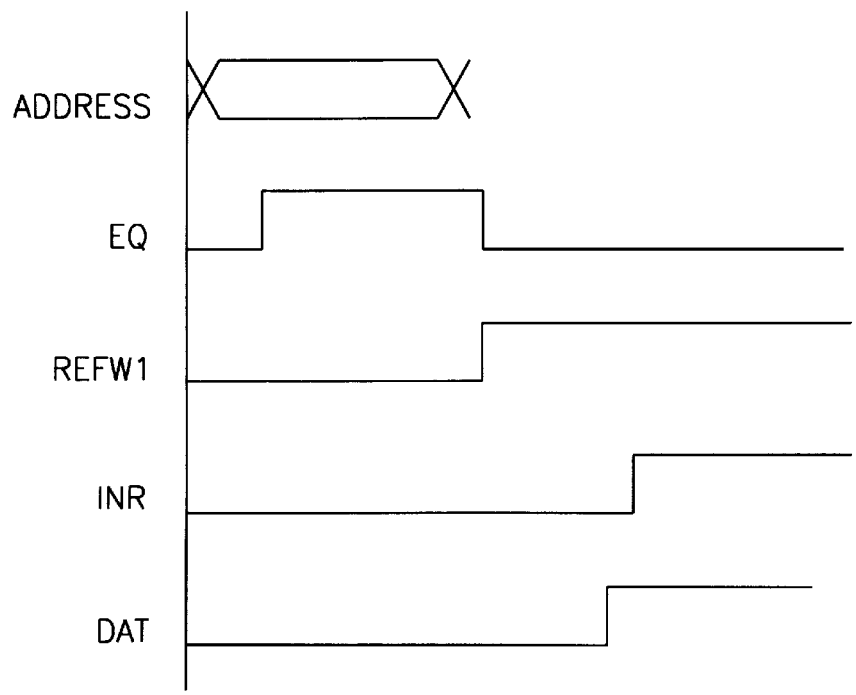
FIG. 4 is timing diagram for the circuit of FIG. 3.
Figure 5:
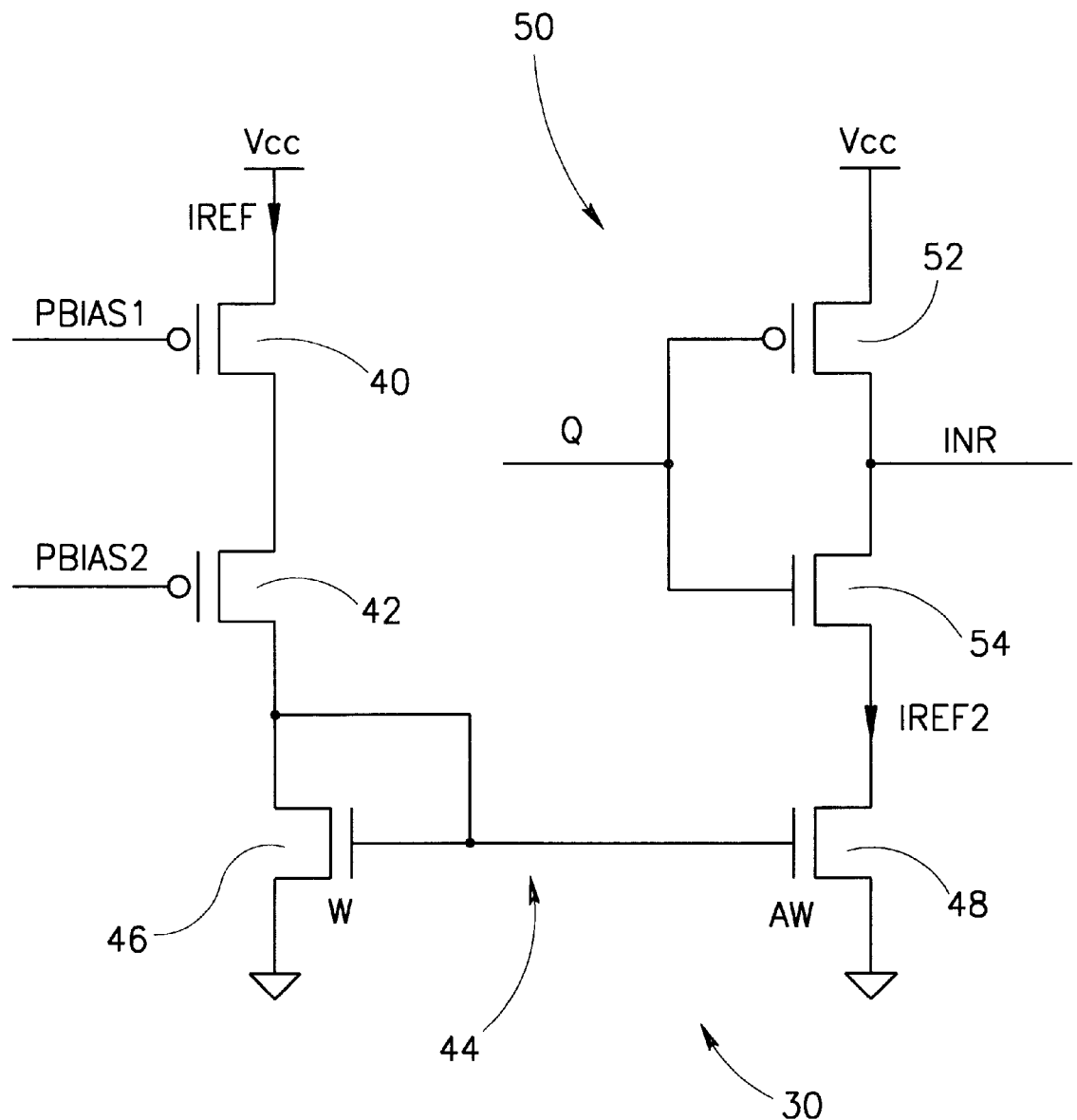
FIG. 5 is a circuit diagram of a generally voltage and temperature insensitive inverter forming part of the PSAD of FIG. 3.

Reference is now made to FIGS. 3, 4 and 5 which illustrate the programmable sense amplifier delay (PSAD) circuit, its timing diagram and the detail of its inverter, respectively, in accordance with a preferred embodiment of the present invention.

The PSAD circuit of FIG. 3 generally matches the temperature and voltage response of the memory array and comprises a generally voltage and temperature insensitive inverter 30, a bandgap voltage reference generator 32 providing voltage insensitive signals to inverter 30, a pre-charging p-channel transistor 34, connected between a voltage source Vcc and an input Q to the inverter 30, a reference cell 36 and an n-channel, bias transistor 39, connected in series between input Q and a ground source, and a plurality of capacitors 38 connected in parallel to the cell 36. As described in more detail hereinbelow, the capacitors 38 provide the delay and are switchably connected to input Q. The more capacitors 38 connected to input Q, the larger the delay.

Reference cell 36 is of the same type as the cells of the memory array and is controlled by an REFW1 signal. Thus, if the memory array is an EPROM array, cell 36 is an EPROM cell while if the memory array is a FLASH EEPROM array, cell 36 is a FLASH EEPROM cell. FIG. 3 shows a FLASH EEPROM cell; however, cell 36 can be any type of cell.

The PSAD circuit of FIG. 3 operates as follows and as indicated by the timing diagrams of FIG. 4. When an address signal is received, the EQ signal goes high, causing the pre-charging, p-channel transistor 34, which receives the complement EQB of the EQ signal, to be activated. Accordingly, the input Q is charged to the voltage source Vcc level. When the EQ signal is deactivated, the REFW1 signal, controlling cell 36, is activated. The BLREF bias signal, from bandgap voltage generator 32 to bias transistor 39, is always active and serves to bias reference cell 36. When the REFW1 signal is activated, input Q signal is discharged through reference cell 36. The rate of discharge is controlled by those capacitors 38 that are selectively shorted to the input Q signal.

As soon as the voltage level of input Q falls by a certain amount, inverter 30 will change its output, thereby activating the INR signal. As will be described hereinbelow and in accordance with a preferred embodiment of the present invention, inverter 30 has a fixed trip point which is a function of the voltage drop, rather than of the absolute voltage level. Therefore, the INR signal will be activated after a fixed voltage drop and the delay can be set to ensure that the voltage drop occurs within a predetermined period of time.

Because inverter 30 responds to a voltage drop, it is generally insensitive to the absolute voltage level of the Vcc source. For example, if Vcc is 4.5V and the voltage drop is 2V, inverter 30 will trip at 2.5V. However, if Vcc is 6V, the inverter 30 will trip at 4V. Nonetheless, due to capacitors 38, the time for the input signal Q to drop the 2V will be consistent over voltage levels Vcc.

The inverter trip-point is also insensitive to temperature as will be described in more detail hereinbelow with respect to FIG. 5.

Since cell 36 is of the same type of cell as the cells of the memory array, its response time will be generally equivalent to the response time of the cells in the array. As temperature changes, the response time of the cells in the array will change. However, the same change will occur to cell 36. Thus, cell 36 matches the temperature response of the PSAD circuit of the present invention with that of the memory array.

Figure 1:
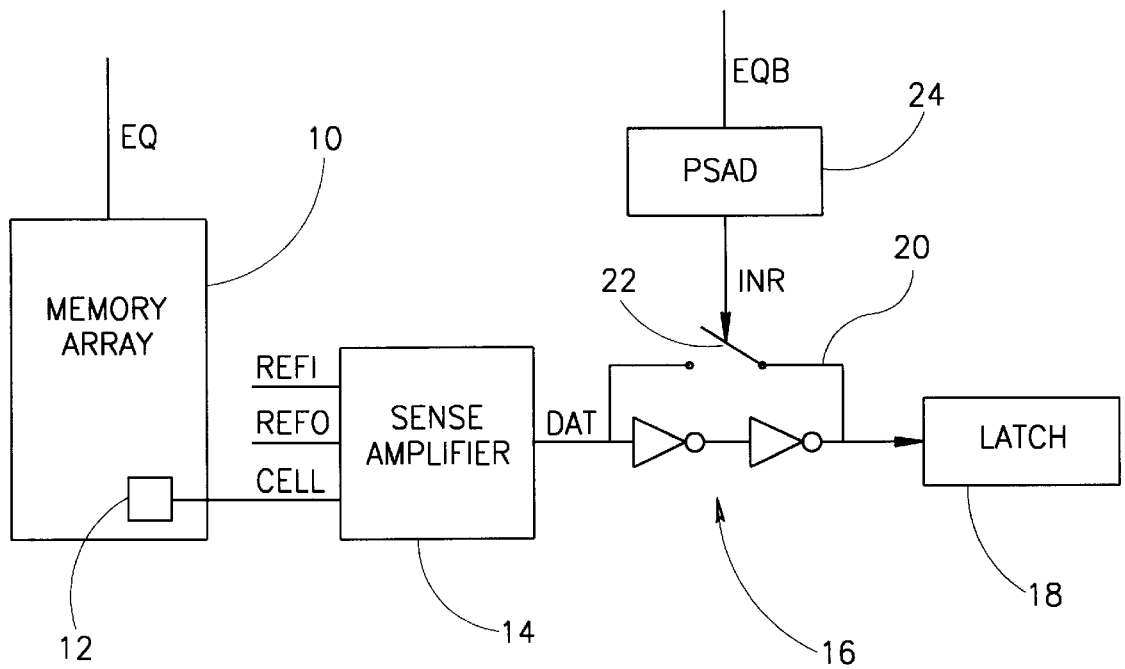
FIG. 1 is a schematic illustration of a prior art sensing circuit for a memory array.
Figure 2:
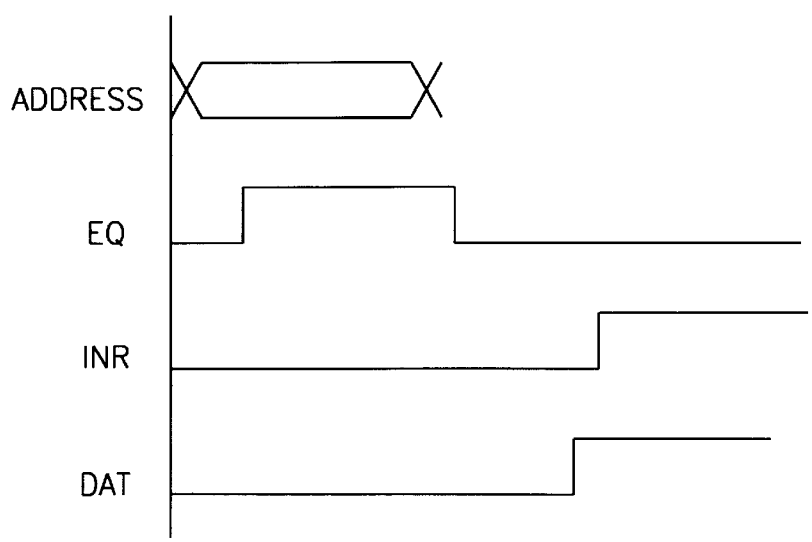
FIG. 2 is timing diagram for the prior art circuit of FIG. 1.

It will be appreciated that the PSAD circuit of the present invention generally matches the temperature and voltage response of the memory array and therefore, can be set once for all sensing conditions. The sensing time might change, due to the changed response time of the cells of the memory array and of cell 36, but since the response time of the PSAD circuit is matched to that of the memory array, the PSAD circuit of FIG. 3 will always activate the INR signal to open switch 22 of the circuit of FIG. 1 after sense amplifier 14 finishes fully sensing the cell 12 of the memory array 10. This is indicated in FIG. 4 where the DAT output of sense amplifier 14 changes before the INR output of the PSAD circuit of FIG. 3 changes.

FIG. 5 illustrates the elements of inverter 30. Typically, inverter 30 comprises two p-channel transistors 40 and 42, a current mirror 44 formed of two n-channel transistors 46 and 48, an inverter 50 formed of a p-channel transistor 52 and an n-channel transistor 54. Transistors 40, 42 and 46 are connected in series in a first branch and transistors 52, 54 and 48 are connected in series to form a second branch. Both branches receive the voltage source Vcc.

Bandgap voltage generator 32 produces the signals PBIAS1 and PBIAS2 which track the movement of the voltage source Vcc. Signals PBIAS1 and PBIAS2 control the gates of p-channel transistors 40 and 42, respectively. Since the voltage levels of signals PBIAS1 and PBIAS2 change in the same way that the voltage level of voltage source Vcc changes, the gate-to-source voltage on transistors 40 and 42 remains the same, despite changes in Vcc level. Accordingly, the current IREF induced in transistors 40 and 42 is fixed with respect to the voltage level of voltage source Vcc.

Current mirror 44 mirrors current IREF to the second branch. Since the size Z of transistor 48 is some multiple A of the size W of transistor 46 (i.e. Z=AW), the current IREF2 through the transistor 48 is A*IREF. Like current IREF, the current IREF2 is generally fixed with respect to the voltage level of voltage source Vcc. However, both currents may be sensitive to changes in temperature.

Inverter 50 will trip as soon as the p-channel transistor 52 generates a current large enough to overcome the current IREF2. The current generation of a transistor is a function of its gate-to-source voltage drop Vgs and p-channel transistor 52 has the input signal Q at its gate and the voltage source Vcc at its source. Therefore, the gate-to-source voltage drop is the difference in voltage levels of Vcc and the input signal Q. Since the relationship of gate-to-source voltage drop Vgs and current generation is fixed for a given transistor, inverter 50 will trip once the voltage level of input signal Q drops a predetermined amount below voltage source Vcc. The function of voltage drop to current generation is fixed by the size (width and length) of the transistor and thus, the desired voltage drop is defined by the size of transistor 52 and the fixed current IREF2.

Accordingly, inverter 30 is generally insensitive to changes in voltage level Vcc and trips whenever the input signal Q drops a predetermined amount below voltage source Vcc.

The inverter trip-point is also insensitive to temperature. This is achieved by biasing p-channel transistor 52 in such a way that the temperature variation of the p-channel transistor 52 matches the temperature variation of the reference current IREF2 which controls the n-channel transistor 48.

It will be appreciated that the present invention is not limited by what has been described hereinabove and that numerous modifications, all of which fall within the scope of the present invention, exist. For example, while the present invention has been described with respect to FLASH memory cells, it also incorporates other types of memory cells, such as EPROM, EEPROM, ROM, PROM, SRAM, DRAM cells.

It will be appreciated by persons skilled in the art that the present invention is not limited by what has been particularly shown and described herein above. Rather the scope of the invention is defined by the claims that follow:

I claim:

1. An inverter which responds to a predetermined voltage drop, the inverter comprising:
    a two transistor inverter controlled by a varying control signal and receiving a voltage source signal as input; and
    means for producing and applying a reference current through said two transistor inverter, wherein said reference current is fixed with respect to the voltage level of said voltage source,
    wherein said two transistor inverter trips when said varying control signal is below said voltage source signal by a predetermined amount that is fixed with respect to temperature and to the voltage level of said voltage source.

2. An inverter according to claim 1 wherein said means for producing and applying includes:
    at least one transistor controlled by a reference signal and receiving a voltage source as input, wherein said reference signal tracks said voltage source, the at least one transistor producing a second reference current; and
    a current mirror connected between the output of said at least one transistor and a ground connection of said two transistor inverter for mirroring a version of said second reference current to said ground connection, thereby to produce said first reference current.

3. An inverter according to claim 1 and wherein said predetermined amount is defined by the size of said two transistor inverter and the strength of said first reference current.

4. An inverter according to claim 1 wherein said first reference current varies with temperature, wherein said two transistor inverter comprises one p-channel transistor and one n-channel transistor, wherein said p-channel transistor is biased to match the temperature variation of said first reference current.

5. A programmable sense amplifier delay (PSAD) circuit which is matched to the response time of a memory array, the memory array having a multiplicity of memory cells, the PSAD circuit comprising:
    an inverter having an input line and receiving a voltage source Vcc, said inverter responding to the predetermined voltage drop between the voltage level of said voltage source Vcc and the voltage on said input line, wherein said inverter is insensitive to changes in temperature and the voltage level of a voltage source;
    a pre-charging, p-channel, pull-up transistor, connected between said voltage source Vcc and said input line and activatable during a pre-charge phase of said memory array to raise the voltage level of said input line towards said voltage source;
    a pull-down transistor of the type of said memory cells connected between said input line and a ground source and activatable after said pre-charge phase to discharge the voltage level of said input line; and
    a plurality of capacitors selectively connected in parallel to said pull-down transistor, said capacitors defining the speed at which said pull-down transistor discharges said input line.

6. A programmable sense amplifier delay (PSAD) circuit which is matched to the response time of a memory array, the memory array having a multiplicity of memory cells, the PSAD circuit comprising:
    an inverter having an input line and receiving a voltage source Vcc, said inverter responding to a predetermined voltage drop between the voltage level of said voltage source Vcc and the voltage on said input line wherein said inverter includes:
        a two transistor inverter controlled by a varying control signal and receiving said voltage source Vcc as input; and
        means for producing and applying a reference current through said two transistor inverter, wherein said reference current is fixed with respect to the voltage level of said voltage source Vcc,
        wherein said two transistor inverter trips when said varying control signal is below the voltage level of said voltage source Vcc by a predetermined amount that is fixed with respect to temperature and to the voltage level of said voltage source Vcc;
    a pre-charging, p-channel, pull-up transistor, connected between said voltage source Vcc and said input line and activatable during a pre-charge phase of said memory array to raise the voltage level of said input line towards said voltage source;
    a pull-down transistor of the type of said memory cells connected between said input line and a ground source and activatable after said pre-charge phase to discharge the voltage level of said input line; and
    a plurality of capacitors selectively connected in parallel to said pull-down transistor, said capacitors defining the speed at which said pull-down transistor discharges said input line.

7. A PSAD circuit according to claim 6 wherein said means for producing and applying includes:
    at least one transistor controlled by a reference signal and receiving a voltage source signal as input, wherein said reference signal tracks said voltage source, the at least one transistor producing a second reference current; and
    a current mirror connected between the output of said at least one transistor and a ground connection of said two transistor inverter for mirroring a version of said second reference current to said ground connection, thereby to produce said first reference current.

8. A PSAD circuit according to claim 6 and wherein said predetermined amount is defined by the size of said two transistor inverter and the strength of said first reference current.

9. A PSAD circuit according to claim 6 wherein said first reference current varies with temperature, wherein said two transistor inverter comprises one p-channel transistor and one n-channel transistor, wherein said p-channel transistor is biased to match the temperature variation of said first reference current.

* * * * *